United States Patent
Kumar et al.

(10) Patent No.: US 10,432,363 B2
(45) Date of Patent: Oct. 1, 2019

(54) PAGE HEALTH PREDICTION USING PRODUCT CODES DECODER IN NAND FLASH STORAGE

(71) Applicant: SK hynix Inc., Gyeonggi-do OT (KR)

(72) Inventors: Naveen Kumar, San Jose, CA (US); Aman Bhatia, San Jose, CA (US); Yi-Min Lin, San Jose, CA (US)

(73) Assignee: SK hynix Inc., Gyeonggi-do (KR)

(*) Notice: Subject to any disclaimer, the term of this patent is extended or adjusted under 35 U.S.C. 154(b) by 0 days.

(21) Appl. No.: 15/674,134

(22) Filed: Aug. 10, 2017

(65) Prior Publication Data

US 2018/0048434 A1    Feb. 15, 2018

Related U.S. Application Data

(60) Provisional application No. 62/374,692, filed on Aug. 12, 2016.

(51) Int. Cl.
| | |
|---|---|
| *G11C 29/00* | (2006.01) |
| *H04L 1/20* | (2006.01) |
| *G06F 11/07* | (2006.01) |
| *G11C 29/50* | (2006.01) |
| *G11C 16/34* | (2006.01) |
| *G11C 11/56* | (2006.01) |
| *G11C 29/02* | (2006.01) |
| *G11C 29/52* | (2006.01) |
| *G06F 11/10* | (2006.01) |
| *G11C 29/56* | (2006.01) |
| *G11C 16/04* | (2006.01) |
| *G11C 29/04* | (2006.01) |

(52) U.S. Cl.
CPC ............ *H04L 1/203* (2013.01); *G06F 11/076* (2013.01); *G06F 11/1012* (2013.01); *G11C 11/5642* (2013.01); *G11C 16/349* (2013.01); *G11C 29/021* (2013.01); *G11C 29/028* (2013.01); *G11C 29/50004* (2013.01); *G11C 29/52* (2013.01); *G11C 16/0483* (2013.01); *G11C 29/56008* (2013.01); *G11C 2029/0409* (2013.01); *G11C 2029/0411* (2013.01); *G11C 2029/5004* (2013.01)

(58) Field of Classification Search
None
See application file for complete search history.

(56) References Cited

U.S. PATENT DOCUMENTS

| | | | |
|---|---|---|---|
| 9,081,677 B2 | 7/2015 | Miyata et al. | |
| 9,214,964 B1* | 12/2015 | Varnica | H03M 13/2909 |
| 9,231,623 B1 | 1/2016 | Kumar et al. | |
| 2009/0177931 A1* | 7/2009 | Song | G06F 11/1012 |
| | | | 714/704 |

(Continued)

*Primary Examiner* — Mujtaba M Chaudry
(74) *Attorney, Agent, or Firm* — IP & T Group LLP

(57) ABSTRACT

An apparatus of a memory system and an operating method thereof includes: a plurality of memory devices; and a controller including a decoder and a BER predictor, coupled with the plurality of memory devices, configured to perform a decoding iteration includes to conduct NAND read and generate NAND data; decode in accordance with the NAND data and generate decoder information by the decoder; predict a BER in accordance with at least the decode information by the BER predictor; and evaluate the predicted BER and generate evaluation result by the BER predictor.

20 Claims, 6 Drawing Sheets

(56) References Cited

U.S. PATENT DOCUMENTS

| | | | |
|---|---|---|---|
| 2010/0088575 A1* | 4/2010 | Sharon | G06F 11/1072 714/763 |
| 2013/0166988 A1* | 6/2013 | Sharon | G06F 11/1012 714/758 |
| 2015/0169406 A1* | 6/2015 | Li | G06F 11/1012 714/763 |
| 2016/0006459 A1* | 1/2016 | Hanham | H03M 13/1108 714/764 |
| 2016/0006462 A1* | 1/2016 | Hanham | H03M 13/3715 714/764 |
| 2016/0179608 A1 | 6/2016 | Gorobets et al. | |
| 2018/0032396 A1* | 2/2018 | Sharon | G06F 11/1072 |

\* cited by examiner

PAGE HEALTH PREDICTION USING PRODUCT CODES DECODER IN NAND FLASH STORAGE

CROSS-REFERENCES TO RELATED APPLICATIONS

This application claims the benefit of U.S. Provisional Application No. 62/374,692 filed Aug. 12, 2016, the entire contents of which are incorporated herein by reference.

BACKGROUND

Field of Invention

Exemplary embodiments of the present disclosure relate to a memory system and an operating method thereof.

Description of Related Arts

In NAND flash storage systems, the read reference voltages are used to divide the possible threshold voltage range of NAND flash memory cells to several windows. A logical value is designated to each of the windows. The logical value of a cell is determined by the voltage window which the cell's threshold voltage is located in. For example, for a single-level cell (SLC), one read reference voltage is needed. When the threshold voltage of a cell is less than the specified read reference voltage, the logical value of the cell sets to "1"; otherwise, the cell's logical value sets to "0". For a multi-level cell (MLC), three read reference voltages are used. For a triple level cell (TLC) device, there are seven read reference voltages.

The threshold voltage of a cell can vary from its intended value for various reasons, such as program and read operation of neighboring cells, the number of program/erase cycles, and the retention time. Therefore, it is possible that the threshold voltage of a cell with an intended value shifts into another voltage window with a different logical value. In this case, when the cell is read, a wrong logical value is given and this error will be counted in the raw bit error rate (RBER) measurement. An optimal read reference voltage can achieve the minimal RBER.

Currently, there are two types of algorithm for the error-correction control solution, the hard-decoding algorithm and the soft-decoding algorithm. For the hard-decoding algorithm, the hard information which indicates that the input information is "0" or "1" is used. However, the soft information is used for the soft-decoding algorithm, which not only tells the decoder if the input information is "0" or "1", but also provides the decoder how likely it is "0" of "1". Usually if soft information is provided, a soft-decoding algorithm provides a better error correction performance than a hard-decoding algorithm. In NAND flash storage systems, an error-correction control solution will try the hard decoding first. When the hard decoding fails, the soft-decoding algorithm will be used.

Thus, there remains a need for a memory system and operating method thereof for page health prediction of the memory system.

SUMMARY

Embodiments of the present disclosure are directed to a memory system and an operating method thereof capable of predicting page health of the memory system.

In accordance with an embodiment of the present invention, there is provided with an operating method of a memory system which includes performing a decoding iteration includes conducting NAND read and generating NAND data; decoding in accordance with the NAND data and generating decoder information; predicting a BER in accordance with at least the decoder information; and evaluating the predicted BER and generating evaluation result.

An apparatus of a memory system comprising: a plurality of memory devices; and a controller including a decoder and a BER predictor, coupled with the plurality of memory devices, configured to perform a decoding iteration includes to conduct NAND read and generate NAND data; decode in accordance with the NAND data and generate decoder information by the decoder; predict a BER in accordance with at least the decode information by the BER predictor; and evaluate the predicted BER and generate evaluation result by the BER predictor.

In accordance with an embodiment of the present invention, there is provided with a memory system which includes a processor; a tangible computer readable storage medium coupled to the processor, embedding the non-transitory computer program product executed by the processor, including computer instructions configured to: performing a decoding iteration includes conducting NAND read and generating NAND data; decoding in accordance with the NAND data and generating decoder information; predicting a BER in accordance with at least the decoder information; and evaluating the predicted BER and generating evaluation result by the BER predictor.

BRIEF DESCRIPTION OF THE DRAWINGS

The above and other features and advantages of the present invention will become more apparent to those skilled in the art to which the present invention pertains by the following detailed description with reference to the attached drawings in which.

DETAILED DESCRIPTION

Figure 1:
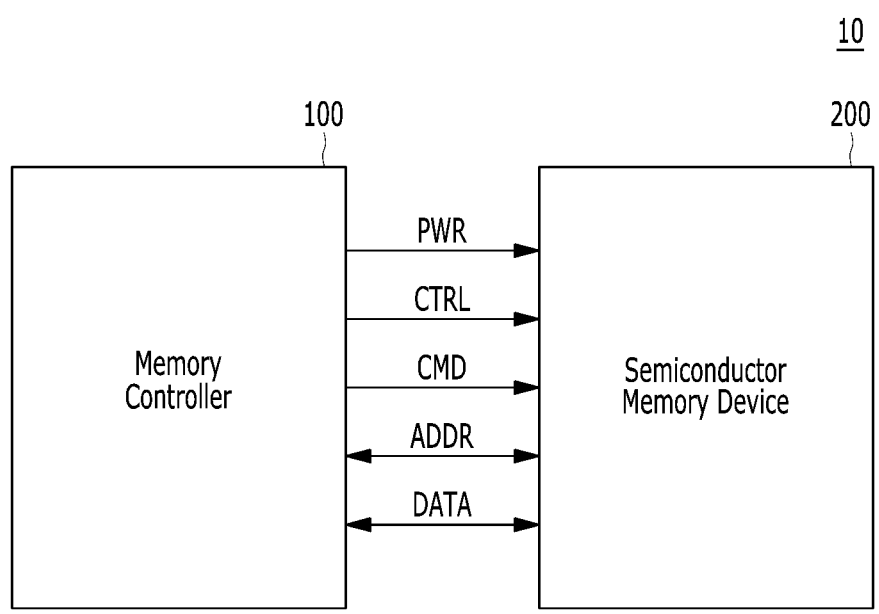
FIG. 1 is a block diagram schematically illustrating a memory system in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The invention can be implemented in numerous ways, including as a process; an apparatus; a system; a composition of matter; a computer program product embodied on a computer readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily suitable for performing the task at a given time or a specific component that is manufactured to perform the task. As used herein, the term 'processor' refers to one or more devices, circuits, and/or processing cores suitable for processing data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

In NAND flash storage, data can be stored and accessed on a page level basis, and pages can be located in a block belonging to a die. Multiple codewords encoded using error control coding scheme can be stored in a single page. In a random data access command, the data is read out from the page and passed to a decoder. If health of the page, such as bit error rate (BER) for a page, can be predicted, the decoding latency can be avoided and a soft read command can be used to decode data. Sometimes, the page health can be so worse that the data cannot be recovered through even the soft decoding. In that case, chip kill information can be used to decode the data. This page health prediction scheme can not only significantly reduce the error recover flow latency, but also provide other advantages, such as improvement of garbage collection algorithm. In embodiments of current invention disclosure, a novel apparatus and algorithm to predict health of a block using product codes decoder is proposed.

Generalized product codes (GPC) have drawn attention recently for their advantages over state of art error control coding schemes, wherein the current error control coding schemes may have issues such as more noises and long latency, since the schemes wait for decoding failure or completion to take next action. Number of failed constituent codewords with a hard decoder or soft decoder at ith iteration can be used to predict BER for a page. A smaller number of iterations is preferred because the smaller number of iterations can indicate less iterations performed to determine the BER and shorten the decoding time.

The proposed page health predication schemes can track the error decoding process before the decoding failure. The noise data can be used to calculate checksum points, wherein the checksum points can be used to create BER lines. A number of the checksum points can be used to locate BER from the BER lines, more checksum points can result in a more accurate BER prediction. Optionally, multiple codewords can be used to replace the checksum points. For example, from simulations, it is observed that 3 iterations decoder information can provide good BER prediction. Even though the number of failed codewords information used to predict BER, other information from decoder can also be used for prediction before fully decoding.

FIG. 1 is a block diagram schematically illustrating a memory system 10 in accordance with an embodiment of the present invention. Referring FIG. 1, the memory system 10 may include a memory controller 100 and a semiconductor memory device 200. The memory controller 100 may control overall operations of the semiconductor memory device 200.

The semiconductor memory device 200 may perform one or more erase, program, and read operations under the control of the memory controller 100. The semiconductor memory device 200 may receive a command CMD, an address ADDR and data through input/output lines. The semiconductor memory device 200 may receive power PWR through a power line and a control signal CTRL through a control line. The control signal may include a command latch enable (CLE) signal, an address latch enable (ALE) signal, a chip enable (CE) signal, a write enable (WE) signal, a read enable (RE) signal, and so on.

The memory controller 100 and the semiconductor memory device 200 may be integrated in a single semiconductor device. For example, the memory controller 100 and the semiconductor memory device 200 may be integrated in a single semiconductor device such as a solid-state drive (SSD). The solid-state drive may include a storage device for storing data therein. When the semiconductor memory system 10 is used in an SSD, operation speed of a host (not shown) coupled to the memory system 10 may remarkably improve.

The memory controller 100 and the semiconductor memory device 200 may be integrated in a single semiconductor device such as a memory card. For example, the memory controller 100 and the semiconductor memory device 200 may be integrated in a single semiconductor device to configure a memory card such as a PC card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and a universal flash storage (UFS).

For another example, the memory system 10 may be provided as one of various elements including an electronic device such as a computer, an ultra-mobile PC (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, one of electronic devices of a home network, one of electronic devices of a computer network, one of electronic devices of a telematics network, a radio-frequency identification (RFID) device, or elements devices of a computing system.

Figure 2:
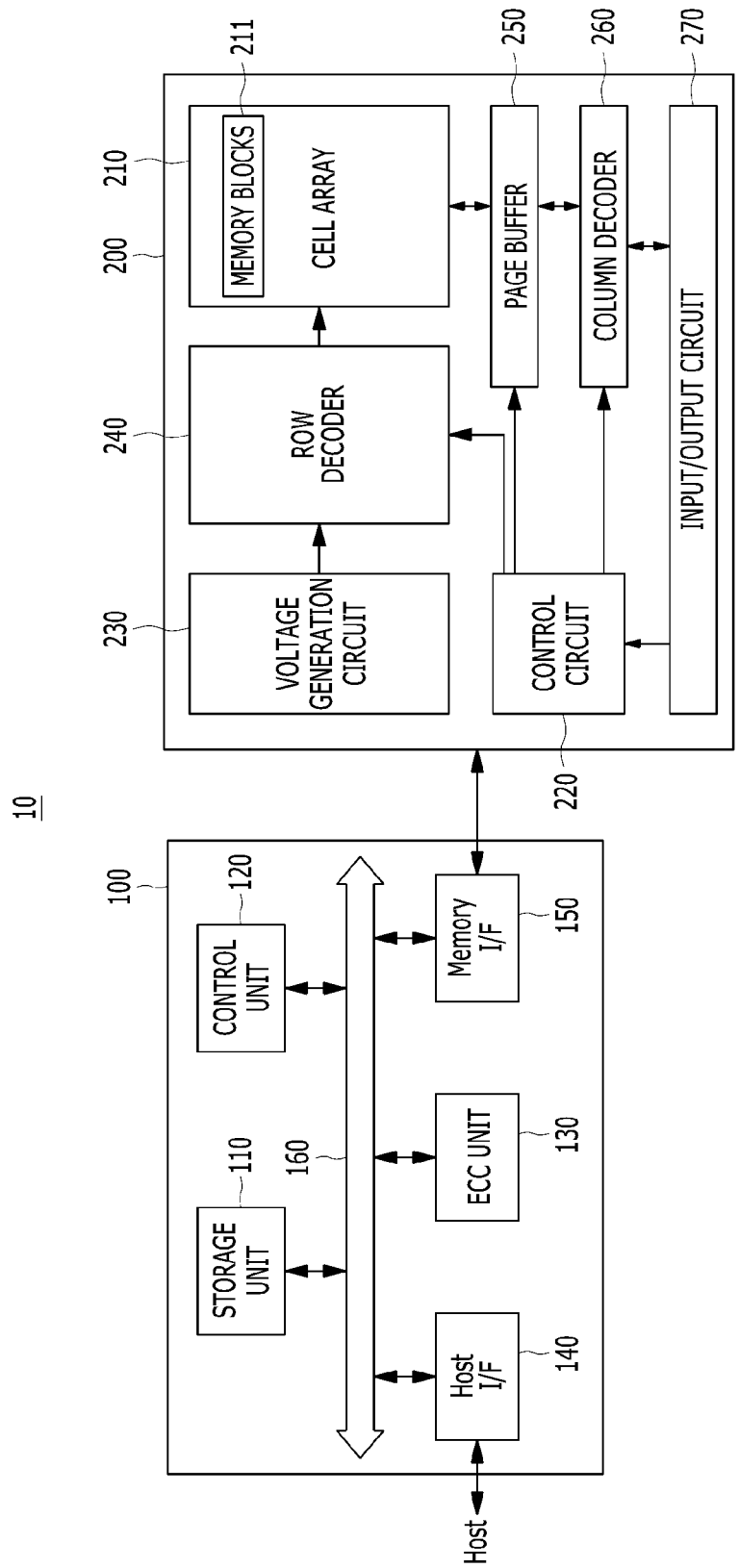
FIG. 2 is a block diagram illustrating a memory system in accordance with an embodiment of the present invention.

FIG. 2 is a detailed block diagram illustrating a memory system in accordance with an embodiment of the present invention. For example, the memory system of FIG. 2 may depict the memory system 10 shown in FIG. 1.

Referring to FIG. 2, the memory system 10 may include a memory controller 100 and a semiconductor memory device 200. The memory system 10 may operate in response to a request from a host device, and in particular, store data to be accessed by the host device.

The host device may be implemented with any one of various kinds of electronic devices. In some embodiments, the host device may include an electronic device such as a desktop computer, a workstation, a three-dimensional (3D) television, a smart television, a digital audio recorder, a digital audio player, a digital picture recorder, a digital picture player, a digital video recorder and a digital video player. In some embodiments, the host device may include a portable electronic device such as a mobile phone, a smart phone, an e-book, an MP3 player, a portable multimedia player (PMP), and a portable game player.

The memory device 200 may store data to be accessed by the host device.

The memory device 200 may be implemented with a volatile memory device such as a dynamic random-access memory (DRAM) and a static random-access memory (SRAM) or a non-volatile memory device such as a read only memory (ROM), a mask ROM (MROM), a programmable ROM (PROM), an erasable programmable ROM (EPROM), an electrically erasable programmable ROM (EEPROM), a ferroelectric random-access memory (FRAM), a phase change RAM (PRAM), a magnetoresistive RAM (MRAM) and a resistive RAM (RRAM).

The controller 100 may control storage of data in the memory device 200. For example, the controller 100 may control the memory device 200 in response to a request from the host device. The controller 100 may provide the data read from the memory device 200, to the host device, and store the data provided from the host device into the memory device 200.

The controller 100 may include a storage unit 110, a control unit 120, the error correction code (ECC) unit 130, a host interface 140 and a memory interface 150, which are coupled through a bus 160.

The storage unit 110 may serve as a working memory of the memory system 10 and the controller 100, and store data for driving the memory system 10 and the controller 100. When the controller 100 controls operations of the memory device 200, the storage unit 110 may store data used by the controller 100 and the memory device 200 for such operations as read, write, program and erase operations.

The storage unit 110 may be implemented with a volatile memory. The storage unit 110 may be implemented with a static random-access memory (SRAM) or a dynamic random-access memory (DRAM). As described above, the storage unit 110 may store data used by the host device in the memory device 200 for the read and write operations. To store the data, the storage unit 110 may include a program memory, a data memory, a write buffer, a read buffer, a map buffer, and so forth.

The control unit 120 may control general operations of the memory system 10, and a write operation or a read operation for the memory device 200, in response to a write request or a read request from the host device. The control unit 120 may drive firmware, which is referred to as a flash translation layer (FTL), to control the general operations of the memory system 10. For example, the FTL may perform operations such as logical to physical (L2P) mapping, wear leveling, garbage collection, and bad block handling. The L2P mapping is known as logical block addressing (LBA).

The ECC unit 130 may detect and correct errors in the data read from the memory device 200 during the read operation. The ECC unit 130 may not correct error bits when the number of the error bits is greater than or equal to a threshold number of correctable error bits, and may output an error correction fail signal indicating failure in correcting the error bits.

In some embodiments, the ECC unit 130 may perform an error correction operation based on a coded modulation such as a low-density parity check (LDPC) code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), a Block coded modulation (BCM), and so on. The ECC unit 130 may include all circuits, systems or devices for the error correction operation.

The host interface 140 may communicate with the host device through one or more of various interface protocols such as a universal serial bus (USB), a multi-media card (MMC), a peripheral component interconnect express (PCI-E), a small computer system interface (SCSI), a serial-attached SCSI (SAS), a serial advanced technology attachment (SATA), a parallel advanced technology attachment (PATA), an enhanced small disk interface (ESDI), and an integrated drive electronics (IDE).

The memory interface 150 may provide an interface between the controller 100 and the memory device 200 to allow the controller 100 to control the memory device 200 in response to a request from the host device. The memory interface 150 may generate control signals for the memory device 200 and process data under the control of the CPU 120. When the memory device 200 is a flash memory such as a NAND flash memory, the memory interface 150 may generate control signals for the memory and process data under the control of the CPU 120.

The memory device 200 may include a memory cell array 210, a control circuit 220, a voltage generation circuit 230, a row decoder 240, a page buffer 250, a column decoder 260, and an input/output circuit 270. The memory cell array 210 may include a plurality of memory blocks 211 and may store data therein. The voltage generation circuit 230, the row decoder 240, the page buffer 250, the column decoder 260 and the input/output circuit 270 form a peripheral circuit for the memory cell array 210. The peripheral circuit may perform a program, read, or erase operation of the memory cell array 210. The control circuit 220 may control the peripheral circuit.

The voltage generation circuit 230 may generate operation voltages having various levels. For example, in an erase operation, the voltage generation circuit 230 may generate operation voltages having various levels such as an erase voltage and a pass voltage.

The row decoder 240 may be connected to the voltage generation circuit 230, and the plurality of memory blocks 211. The row decoder 240 may select at least one memory block among the plurality of memory blocks 211 in response to a row address RADD generated by the control circuit 220, and transmit operation voltages supplied from the voltage generation circuit 230 to the selected memory blocks among the plurality of memory blocks 211.

The page buffer 250 is connected to the memory cell array 210 through bit lines BL (not shown). The page buffer 250 may precharge the bit lines BL with a positive voltage, transmit/receive data to/from a selected memory block in program and read operations, or temporarily store transmitted data, in response to a page buffer control signal generated by the control circuit 220. The column decoder 260 may transmit/receive data to/from the page buffer 250 or transmit/receive data to/from the input/output circuit 270.

The input/output circuit 270 may transmit, to the control circuit 220, a command and an address, transmitted from an external device (e.g., the memory controller 100), transmit data from the external device to the column decoder 260, or output data from the column decoder 260 to the external device, through the input/output circuit 270. The control circuit 220 may control the peripheral circuit in response to the command and the address.

Figure 3:
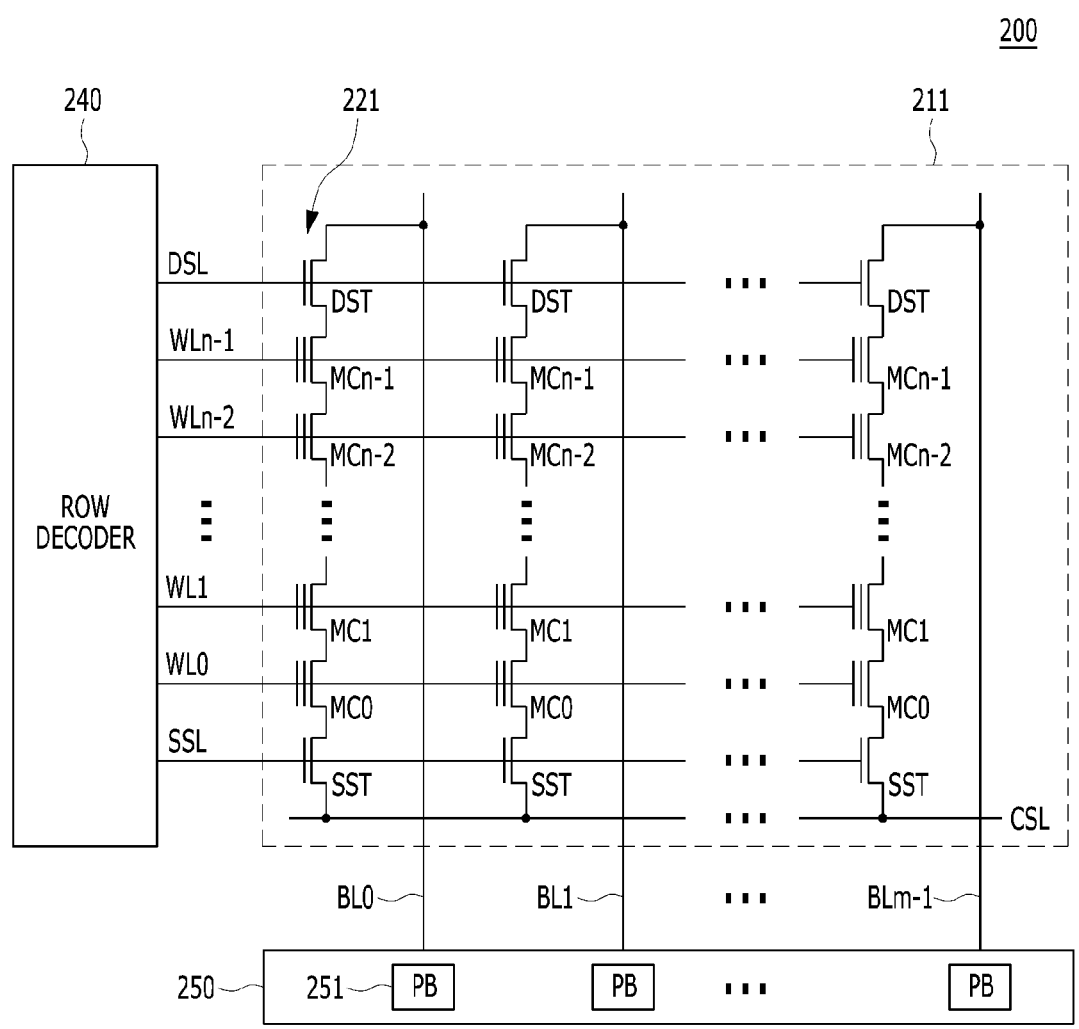
FIG. 3 is a circuit diagram illustrating a memory block of a memory device in accordance with an embodiment of the present invention.

FIG. 3 is a circuit diagram illustrating a memory block of a semiconductor memory device in accordance with an embodiment of the present invention. For example, a memory block of FIG. 3 may be the memory blocks 211 of the memory cell array 200 shown in FIG. 2.

Referring to FIG. 3, the memory blocks 211 may include a plurality of cell strings 221 coupled to bit lines BL0 to BLm−1, respectively. The cell string of each column may include one or more drain selection transistors DST and one or more source selection transistors SST. A plurality of memory cells or memory cell transistors may be serially coupled between the selection transistors DST and SST. Each of the memory cells MC0 to MCn−1 may be formed of a multi-level cell (MLC) storing data information of multiple bits in each cell. The cell strings 221 may be electrically coupled to the corresponding bit lines BL0 to BLm−1, respectively.

In some embodiments, the memory blocks 211 may include a NAND-type flash memory cell. However, the memory blocks 211 are not limited to the NAND flash memory, but may include NOR-type flash memory, hybrid flash memory in which two or more types of memory cells are combined, and one-NAND flash memory in which a controller is embedded inside a memory chip.

Figure 4:
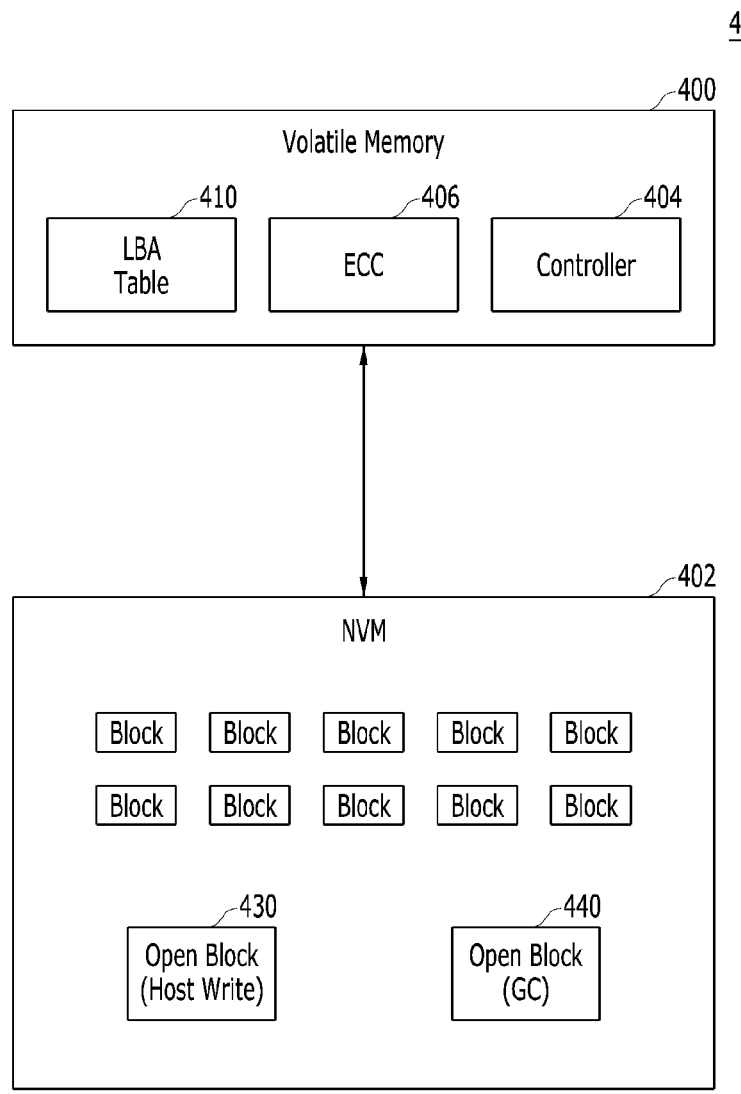
FIG. 4 is a diagram illustrating multiple optimal read reference voltages of a memory system in accordance with an embodiment of the present invention.

FIG. 4 is a diagram schematically illustrating top level block diagram of a memory system in accordance with an embodiment of the present invention. At FIG. 4, a general example of a memory system 40 is shown. The memory system 40 may include a volatile memory 400 (e.g., a DRAM) and a non-volatile memory (NVM) 402 (e.g., NAND) in communication with the volatile memory 400. The volatile memory 400 may include a controller 404, such as the controllers described herein, an error correcting code module 406, and a logical bit address LBA table 410 for mapping physical to logical addresses of bits. The NVM 402 may include a plurality of memory blocks (and/or a plurality of super memory blocks), as well as an open block for host writes 430 and an open block for garbage collection (GC) 440. The memory system 40 shows a general memory system, and additional/alternative components that may be utilized with memory systems to effectuate the invention disclosed herein will be understood to those of skill in the art.

As referred to herein, terms such as "NAND" or "NVM" may refer to non-volatile memories such as flash memories which may implement error correcting code processes. Further, "DRAM" may refer to volatile memories which may include components such as controllers and ECC modules.

Since data written on a NAND is subject to read errors (e.g., bit flips when read), the data written on the NAND may be protected by error correcting codes "ECCs". However, ECC decoding may still fail in some cases, such as cases due to NAND defects or other interferences.

To recover data after an ECC error, XOR-based recovery schemes are commonly used. In general, with an XOR-based scheme, the bitwise XOR of data pages from different die-plane pairs may be calculated and saved in a page called a "parity page", which together with the data pages may be referred to as a "stripe".

Figure 5:
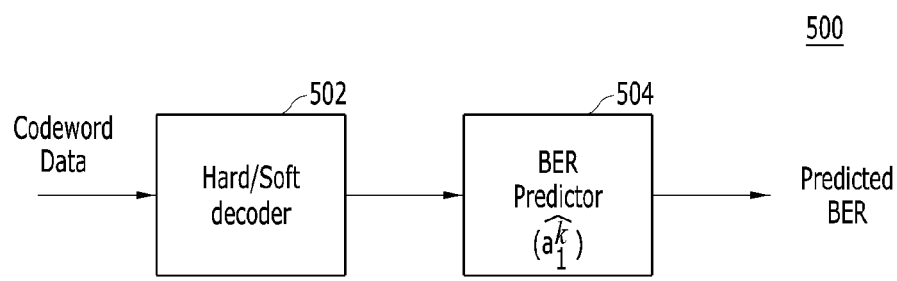
FIG. 5 is a diagram schematically illustrating top level block diagram of page health prediction of a memory system in accordance with an embodiment of the present invention.

FIG. 5 is a diagram schematically illustrating top level block diagram of page health prediction of a memory system in accordance with an embodiment of the present invention. The top level diagram 500 can comprise a hard/soft decoder 502 and a BER predictor 504. The codeword data can be input to the hard/soft decoder 502, and output of the BER predictor 504 can be predicated BER.

The codeword data coded with the error control coding scheme can be provided to the hard/soft decoder 502 for decoding. If the codewords of the codeword data can be decoded successfully, the iteration decoding process can be ended successfully. If the codewords of the codeword data cannot be decoded successfully, the failed codewords at ith iteration can be used for the BER estimation or predication. Typically, the hard/soft decoder 502 starts with hard decoding, and proceed with soft decoding when the hard decoding is failed.

The BER estimation can be defined as $$\widehat{\alpha_1^k} = \mathrm{argmin}_{\alpha_i} k(\mathrm{BER} - \Sigma_{i=1}^k F_i \alpha_i)^2$$

Where the BER is the bit error rate of the codeword of the codeword data, $F_i$ is the number of failed constituent codewords at ith iteration from the hard/soft decoder 502, $\alpha_i$ is the estimator coefficient for the prediction, "argmin" stands for argument of the minimum, which is smallest value of function of the arguments.

If L samples are used to find the estimated $\widehat{\alpha_1^k}$, the BER vector can be written as, $$A\alpha_1^k = B, \text{ where}$$

$$A = \begin{pmatrix} F_1^1 & \cdots & F_k^1 \\ \vdots & \ddots & \vdots \\ F_1^L & \cdots & F_k^L \end{pmatrix} \text{ and } B = \begin{pmatrix} BER_1 \\ BER_2 \\ \vdots \\ BER_L \end{pmatrix}.$$

Where the L samples comprises L samples for different data points, and corresponding L codewords with different BER can be generated offline and decoding thereof can be performed for k iterations. Each row of matrix A corresponds to one of the L vectors/samples, and each of the L samples comprises the numbers of failed constituent codewords of each of the k iterations. Wherein more elements or points in the L samples can predict higher accuracy of line slope, resulting in more accurate BER prediction.

The estimated $\widehat{\alpha_1^k}$ is given as, $$\widehat{\alpha_1^k} = (A^T A)^{-1} A^T B,$$

Where $A^T$ is transpose of A, $(A^T A)^{-1}$ is inverse of $(A^T A)$. Observed in simulations, after 3 iterations, the decoder data of matrix A entities is good enough to predict the BER with reasonable accuracy. A tradeoff between the accuracy of the BER prediction and the number of iterations k needs to be determined in accordance with the memory system configuration.

Figure 6:
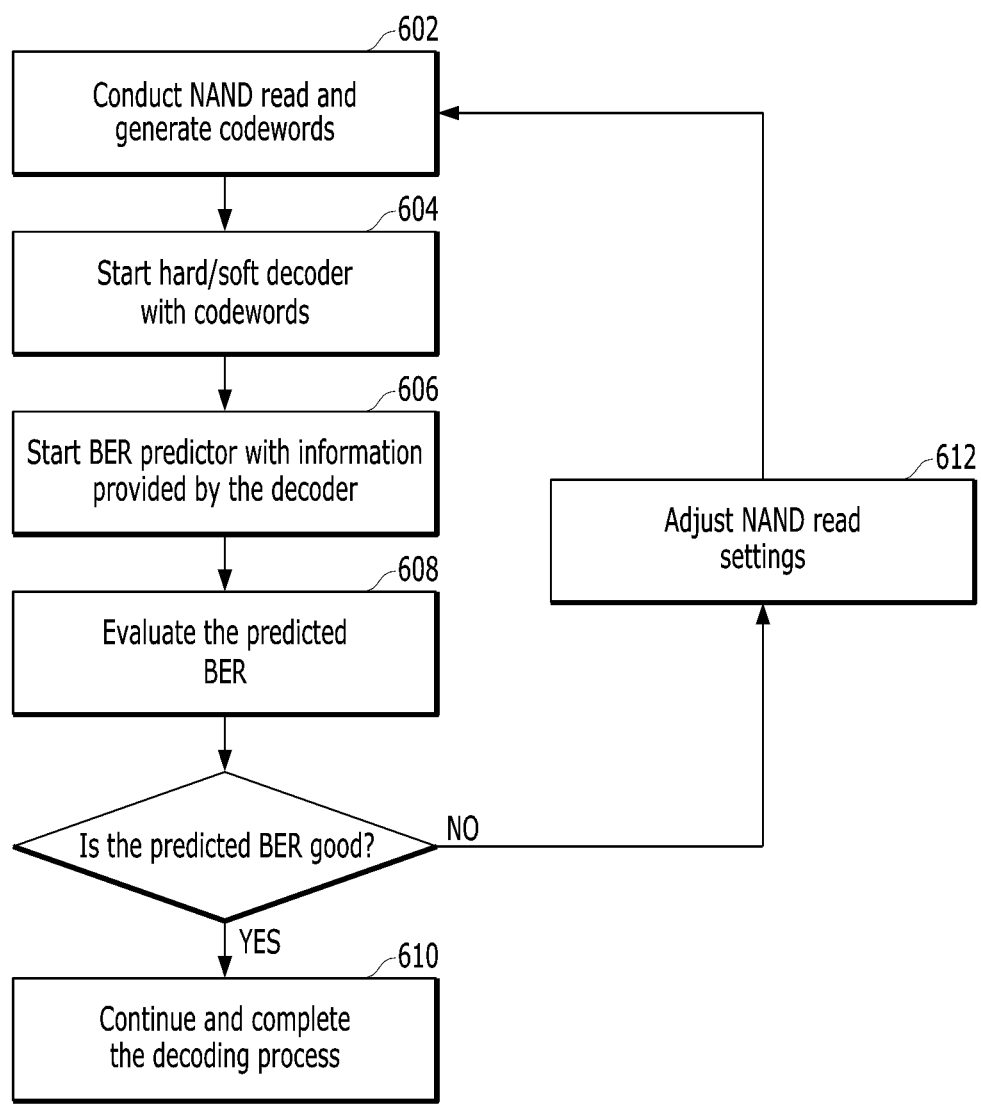
FIG. 6 is a flow diagram illustrating page health prediction of a memory system in accordance with an embodiment of the present invention.

FIG. 6 is a flow diagram illustrating page health prediction of a memory system in accordance with an embodiment of the present invention. The page health prediction process can include numerous iterations, although a typical number of iteration can be set as three.

For example, the page health prediction process can start from a NAND read and codewords generation in a step of 602. During the first iteration when i=1, a first codeword data, such as the first set of L samples, can be provided to the hard/soft decoder 502 of FIG. 5, wherein the index i is an integer and 1≤i≤k. The hard/soft decoder 502 can starts the decoding process at time T1 in a step of 604. As soon as sufficient decoder information collected to start the BER prediction process, the hard/soft decoder 502 can forward the collected decoder information to the BER predictor 504 to start the BER prediction process at time T2 in a step of 606, wherein the collected decoder information can include the numbers of failed constituent codewords of the L samples at the current iteration, such as iteration 0. For example, the BER prediction process can provide a prediction result at time T3 before the decoding process can be completed at time T4, wherein T1<T2<T3<T4. The collected decoder information can include product codes, wherein the product codes can be constructed in any number dimensions by interleaving data in any dimension. For example, when m denotes the number of dimension and l denotes the number of iterations, the product codes can be constructed with a number of the features of data information, such as the number of codewords decoded and number of codewords failed in each dimension. The number of features of data information can be calculated as 2*m*l, wherein the features of data information can be provided for predicting BER.

The BER predictor 504 can calculate the predicted BER before the decoding iteration completion. The predicted BER can be provided to a plurality functional blocks for various purposes, such that, the ECC controller can use the predicted BER to evaluate and further optimize the ECC process, or the memory controller can use the predicted BER to choose an optimal read reference threshold. The predicted BER can be evaluated and categorized in a step of 608, such that the predicted BER can be categorized to different levels, such as good, bad, or very bad.

If the predicted BER is evaluated as good, most likely that the decoding iteration can be successful, the decoding iteration can be continued until completion in a step of 610. If the predicted BER is evaluated as not good, the NAND read settings can be adjusted in accordance with the predicted BER of the current iteration in a step of 612, a second NAND read can be performed, and a second codeword data, such as a second set of L samples can be provided to the hard/soft decoder 502 to start a second iteration of decoding, where i=2. The NAND read setting for the second NAND read can be adjusted responsively to the current predicted BER, such that, if the predicted BER is very bad the NAND setting can be adjusted dramatically, or if the predicted BER is bad but not very bad, the NAND setting can be adjusted moderately. The second iteration of decoding and BER predication can be performed with the second set of codeword data, the predicted BER can be evaluated again to determine if another iteration is needed for a successful decoding.

Optionally, the BER evaluation may be repeated in the same iteration a certain time after the first BER evaluation, with an updated set of the numbers of failed constituent codewords of the L samples at the current iteration, when the categorization of the predicted BER is bad but not very bad. The probability of successful decoding can be re-evaluated, the updated evaluation result can be used to determine whether the decoding process can continuedly proceed, or to adjust the NAND read setting and restart another decoding iteration.

The parameters for categorizing the predicted BER can be predetermined in accordance with the memory system configuration. For a certain value of the predicted BER, categorization of the predicted BER as good, bad, or very bad, can be different in different memory system. For example, a predicted BER can be categorized as good in one memory system, or as bad in another memory system.

If a third iteration is needed for the successful decoding, the NAND read settings can be adjusted again for a third NAND read and a third decoding iteration, where i=3. The hard/soft decoder 502 and the BER predictor 504 can repeat the decoding iterations described above, and more iterations may be conducted. The maximum number of iterations can be predetermined in accordance with the memory system configuration and request. However, simulation shows that 3 iterations can be sufficient to estimate a reasonably accurate BER without prolonging the decoding process.

The embodiments of the present invention disclose a memory system and operating method thereof for predicting page health of the memory blocks. The page health prediction is very important to the memory system, since the accurate page health prediction can reduce the write amplification and decoding latency time. The page health prediction, such as the predicted BER, can be used in various applications, such as ECC controller for optimizing ECC process, or memory controller for selecting an optimal read reference threshold.

Advanced to the traditional decoding process, instead of waiting until the end of the decoding process to know if the decoding process is successful, the embodiments of the present invention provide a novel memory system and operating method thereof, which can predict whether the decoding process can be successful ahead of completion of the current decoding iteration. Furthermore, the prediction can be utilized to adjust NAND read settings and restart another decoding iteration with updated NAND data according to the adjusted NAND read settings, resulting in a more accurate prediction and a shorter decoding latency time.

Another application of utilization of the page health prediction can be for garbage collection of the memory system. It has been discovered that the memory system and the operating method of page health prediction can dramatically improve the decoding success rate and reduce decoding latency time, further improve the memory system performance and reduce the power consumption.

Figure 7:
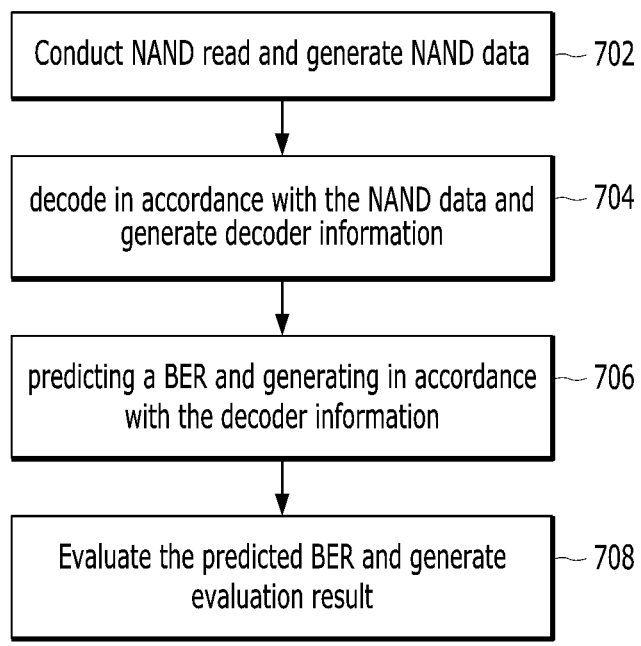
FIG. 7 is a flow chart illustrating a method of page health prediction of a memory system in accordance with a further embodiment of the present invention.

FIG. 7 is a flow chart illustrating a method of page health prediction of a memory system in accordance with a further embodiment of the present invention. The method comprising: performing a decoding iteration includes conducting NAND read and generating NAND data in a block of 702; decoding in accordance with the NAND data and generating decoder information in a block of 704; predicting a BER in accordance with the decoder information in a block of 706; and evaluating the predicted BER and generating evaluation result in a block of 708.

Thus, it has been discovered that the architecture of a memory system of the present invention furnishes important and heretofore unknown and unavailable solutions, capabilities, and functional aspects for a unified optimized acceleration architecture. The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems fully compatible with conventional manufacturing methods or processes and technologies.

Another important aspect of the present invention is that it valuably supports and services the historical trend of reducing costs, simplifying systems, and increasing performance. These and other valuable aspects of the present invention consequently further the state of the technology to at least the next level.

While the invention has been described in conjunction with a specific best mode, it is to be understood that many alternatives, modifications, and variations will be apparent to those skilled in the art in light of a foregoing description. Accordingly, it is intended to embrace all such alternatives, modifications, and variations that fall within the scope of the included claims. All matters hitherto fore set forth herein or shown in the accompanying drawings are to be interpreted in an illustrative and non-limiting sense.

What is claimed is:

1. An operating method of a memory system comprising: performing
   reading data from a page in a NAND memory of the memory system to generate a set of codewords;
   starting to decode the set of codewords and generating decoder information therefrom, the decoder information including information generated before completing the decode operation in a current iteration including a number of codewords not successfully decoded in each past iteration and during a portion of the current iteration;
   predicting a bit error rate (BER) of the page before completing the decode operation in the current iteration in accordance with at least the decoder information; and
   evaluating the predicted BER and generating an evaluation result to determine whether to complete the decode operation in the current iteration, and when it is determined to complete the decode operation in the current iteration, further determine a type of decoding to be used in completing the decode operation.

2. The method of claim 1 wherein the reading of data from the page in the NAND memory is performed according to select NAND read settings.

3. The method of claim 1 wherein the set of codewords are generated using an error control coding scheme.

4. The method of claim 1 wherein the type of decoding is determined from among at least hard decoding and soft decoding.

5. The method of claim 1 wherein the decoder information includes a product code.

6. The method of claim 1 wherein the predicting of the BER of the page in accordance with at least the decoder information is performed again after completing the decode operation in the current iteration.

7. The method of claim 1 wherein the evaluation result includes an indication of whether another complete or partial iteration is to be performed, the partial iteration not including the reading.

8. The method of claim 1 wherein the evaluation result includes an indication that another iteration is not to be performed.

9. The method of claim 7 further comprising: adjusting a read setting according to at least the predicted BER, and repeating the iteration when the evaluation result indicates that another complete iteration is to be performed.

10. The method of claim 7 wherein, based on the evaluation result, another partial iteration is performed to generate updated decoder information, update the BER prediction, and re-evaluate the updated BER prediction.

11. An apparatus of a memory system comprising:
   a memory device; and
   a controller including a decoder and a BER predictor, coupled with the memory device, the controller configured to
      read data from a page in the memory device to generate a set of codewords;
      start to decode the set of codewords using the decoder and generate decoder information therefrom, the decoder information including information generated before completing the decode operation in a current iteration including a number of codewords not successfully decoded in each past iteration and during a portion of the current iteration;
      predict a bit error rate (BER) of the page before completing the decode operation in the current iteration in accordance with at least the decode information, using the BER predictor; and
      evaluate the predicted BER and generate an evaluation result to determine whether to complete the decode operation in the current iteration, using the BER predictor, and when it is determined to complete the decode operation in the current iteration, further determine a type of decoding to be used in completing the decode operation.

12. The apparatus of claim 11 wherein the read of the data from the page in the memory device is performed according to select read settings, and the set of codewords are generated using an error control coding scheme.

13. The apparatus of claim 11 wherein the type of decoding is determined from among at least hard decoding and soft decoding.

14. The apparatus of claim 11 wherein the decoder information includes a product code.

15. The apparatus of claim 11 wherein the controller is further configured to predict the BER again, using the BER predictor, after completing the decode operation in the current iteration.

16. The apparatus of claim 11 wherein the evaluation result includes an indication of whether another complete or partial iteration is to be performed, the partial iteration not including the read operation.

17. The apparatus of claim 11 wherein the evaluation result includes an indication that another iteration is not to be performed.

18. The apparatus of claim 11 wherein the controller is further configured to adjust a read setting according to at least the predicted BER, and repeat the iteration when the evaluation result indicates that another complete iteration is to be performed.

19. The apparatus of claim 16 wherein the controller is further configured to perform another partial iteration, based on the evaluation result, to generate updated decoder information, update the BER prediction, and re-evaluate the updated BER prediction.

20. A memory system comprising:
   a processor;

a tangible computer readable storage medium coupled to the processor, embedding the non-transitory computer program product executed by the processor, including computer instructions for:

reading data from a page in a NAND memory of the memory system to generate a set of codewords;

starting to decode the set of codewords and generating decoder information therefrom, the decoder information including information generated before completing the decode operation in a current iteration including a number of codewords not successfully decoded in each past iteration and during a portion of the current iteration;

predicting a bit error rate (BER) of the page before completing the decode operation in the current iteration in accordance with at least the decoder information; and evaluating the predicted BER and generating an evaluation result to determine whether to complete the decode operation in the current iteration, and when it is determined to complete the decode operation in the current iteration, further determine a type of decoding to be used in completing the decode operation.

* * * * *